United States Patent [19]

Morita et al.

[11] Patent Number: 5,377,079
[45] Date of Patent: Dec. 27, 1994

[54] ELECTRONIC DEVICE AND ITS PRODUCTION METHOD

[75] Inventors: Takeshi Morita; Osamu Hayashi, both of Hyogo, Japan

[73] Assignee: Mitsubishi Denki Kabushiki Kaisha, Tokyo, Japan

[21] Appl. No.: 188,075

[22] Filed: Jan. 27, 1994

Related U.S. Application Data

[62] Division of Ser. No. 900,121, Jun. 18, 1992, Pat. No. 5,329,696.

[30] Foreign Application Priority Data

Jun. 24, 1991 [JP] Japan ................... 3-151932

[51] Int. Cl.$^5$ ............................................. H05K 5/00
[52] U.S. Cl. ............................................. 361/752
[58] Field of Search ............... 361/728, 684, 737, 752, 361/757; 439/68; 437/209

[56] References Cited

U.S. PATENT DOCUMENTS

4,751,126 6/1988 Oodaira et al. ................... 428/901

FOREIGN PATENT DOCUMENTS

4-137698 5/1992 Japan ................... 361/752

*Primary Examiner*—Leo P. Picard
*Assistant Examiner*—D. Sparks
*Attorney, Agent, or Firm*—Wolf, Greenfield & Sacks

[57] ABSTRACT

An electronic device comprises a housing made of a polycarbonate resin, and a novel double-sided printed circuit board. The printed circuit board has one side embedded in the housing, and the other side exposed to the interior of the housing. A plurality of refractory electronic components are mounted onto one side of the printed circuit board and include a resistor and a capacitor. A plurality of lower refractory electronic components are mounted onto the other side of the housing and include a semiconductor integrated circuit, and a transformer. Preferably, an insulating layer is applied to cover the one side of the printed circuit board and the refractory electronic components. Also, a metal layer is applied to cover the insulating layer and the inner surface of the housing.

9 Claims, 2 Drawing Sheets

ELECTRONIC DEVICE AND ITS PRODUCTION METHOD

This application is a division of application Ser. No. 900,121, filed Jun. 18, 1992 now U.S. Pat. No. 5,329,696.

BACKGROUND OF THE INVENTION

1. Field of the Invention

The present invention relates to an electronic device wherein a housing and a printed circuit board are integrally formed together, and a method of manufacturing the same.

2. Description of the Related Art

A conventional electronic device includes a housing made of synthetic resin, and a flexible printed circuit board integrally mounted in the housing, as disclosed in Japanese Laid-Open Patent Publication No. 63/80597. The printed circuit board has one side embedded in the housing and the other side exposed to the interior of the housing. An aluminum foil is placed between the one side of the printed circuit board and the housing. A plurality of electronic components are mounted onto the other side of the housing, only. In the prior art device, substantial space is required for a large number of electronic components. In such a case, the size of the device increases.

SUMMARY OF THE INVENTION

Accordingly, it is an object of the present invention to provide an electronic device and a method of manufacturing same, which allow mounting of a greater number of electronic components than the prior art device without bringing about an increase in size, and which is highly reliable in operation.

According to one aspect of the present invention, there is provided an electronic device comprising a housing made of synthetic resin, a printed circuit board having one side embedded in the housing, and the other side exposed to the interior of the housing, wherein a plurality of refractory electronic components are mounted onto the one side of the printed circuit board, and a plurality of lower refractory electronic components are mounted onto the other side of the printed circuit board. The electronic device of the present invention provides a novel double-sided printed circuit board to allow mounting of more electronic components than in a presently available single-sided printed circuit board without increasing its size.

Preferably, an insulating layer is applied to cover the one side of the printed circuit board and the refractory electronic components. The insulating layer may be made of the same resin as the housing, for example, a polycarbonate resin. Also, a metal layer is applied to cover the insulating layer and the inner surface of the housing so as to provide an electromagnetic shield.

According to another aspect of the present invention, there is provided a method of manufacturing an electronic device, comprising the steps of mounting a plurality of refractory electronic components onto one side of a printed circuit board, attaching the printed circuit board to a male mold so as to face the one side of the printed circuit board against a female mold, cooperating with the male mold and the female mold to define a cavity therebetween, introducing a resin into the cavity to mold a housing such that the one side of the printed circuit board is embedded in the housing, and the other side of the printed circuit board is exposed to the interior of the housing, and mounting a plurality of lower refractory electronic components onto the other side of the printed circuit board.

According to a further aspect of the present invention, there is provided a method of manufacturing an electronic device, comprising the steps of mounting a plurality of refractory electronic components onto one side of a printed circuit board, attaching the printed circuit board to a male mold so as to face the one side of the printed circuit board against a female mold, applying an insulating layer to cover the one side of the printed circuit board and the refractory electronic components, applying a metal layer to cover the insulating layer and at least part of the male mold, cooperating with the male mold and the female mold to define a cavity therebetween, introducing a resin into the cavity to mold a housing such that the one side of the printed circuit board is embedded in the housing, and the other side of the printed circuit board is exposed to the interior of the housing, and mounting a plurality of lower refractory electronic components onto the other side of the printed circuit board.

The refractory electronic components are soldered to the one side of the printed circuit board. A solder material preferably includes an alloy of lead and silver when the housing is made of a polycarbonate resin. The insulating layer and at least part of the male mold are first electrolessly plated with copper or aluminum, and then, electrolytically plated with the same metal to form a metal layer on the insulating layer. Alternatively, copper or aluminum may be vapor deposited on the insulating layer and at least part of the male mold. Also, a copper or aluminum foil may be provided on the insulating layer and at least part of the male mold.

These and other objects, and advantages of the present invention will be apparent from the following detailed description of preferred embodiments when taken in conjunction with the accompanying drawings.

DETAILED DESCRIPTION OF THE PREFERRED EMBODIMENTS

Figure 1:
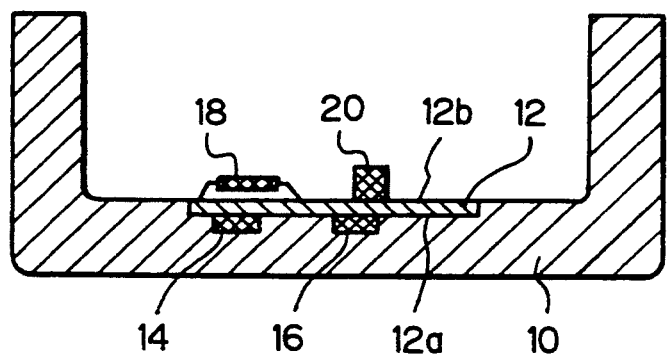
FIG. 1 is a sectional view of an electronic device made according to one embodiment of the present invention.
Figure 2:
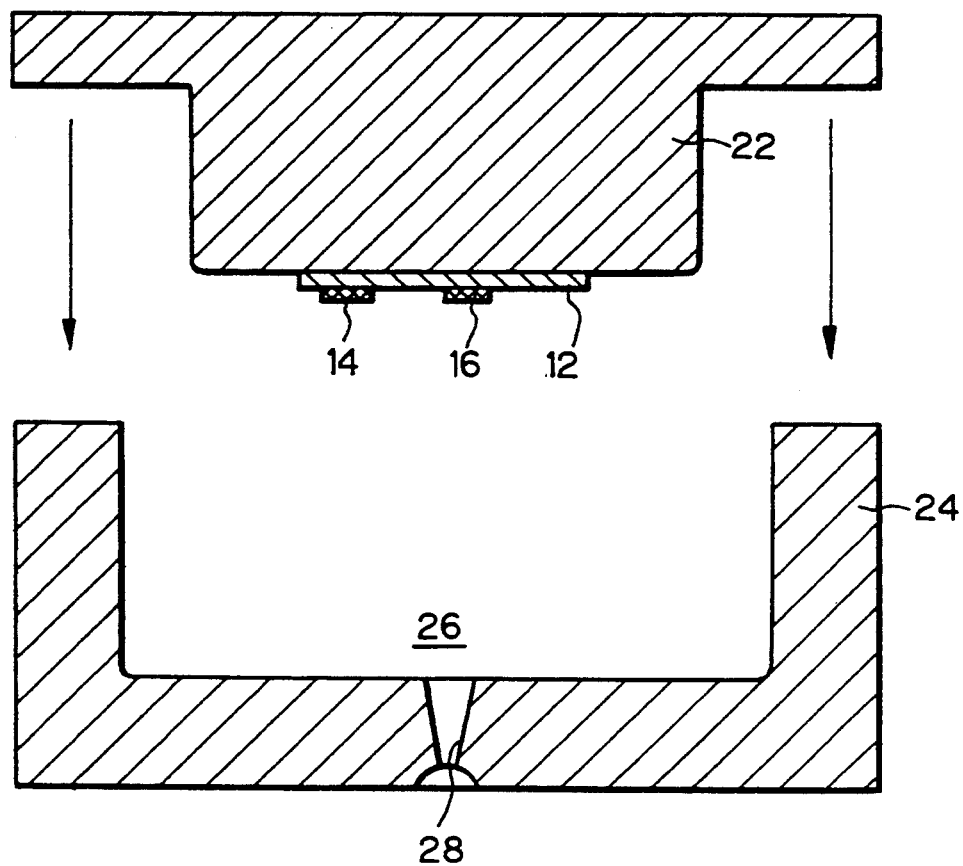
FIG. 2 is a sectional view showing the manner in which the electronic device shown in FIG. 1 is manufactured.

FIG. 2 illustrates a method of manufacturing the electronic device of FIG. 1. Specifically, the resistor 14, the capacitor 16 and other refractory components are first soldered to the one side 12a of the printed circuit board 12. The solder should stand a temperature at which a resin used to mold the housing may flow and is, preferably, an alloy of lead and silver (2 to 4 percent by weight) when a polycarbonate resin, which flows at a temperature of 300° C., is used. Also, when a resin having a higher melting point than a polycarbonate resin may flow is used, an alloy of gold and silicon (5 to 7 percent by weight) or germanium (10 to 15 percent by weight) is preferred. The printed circuit board 12 is then tentatively attached to the bottom of a male mold 22, for example, by an adhesive so as to face the one side 12a of the printed circuit board 12 against a female mold 24. The male mold 22 and the female mold 24 cooperate together to define a cavity 26 therebetween. A polycarbonate resin is introduced through a gate 28 into the cavity 26 to mold the housing 10 such that the one end 12a of the printed circuit board 12 is embedded in the housing 10, and the other side 12b of the printed circuit board 12 is exposed to the interior of the housing 10. Finally, the semiconductor integrated circuit 18, the transformer 20 and other lower refractory components are mounted onto the other side 12b of the printed circuit board 12 by resistance welding or similar means.

Figure 3:
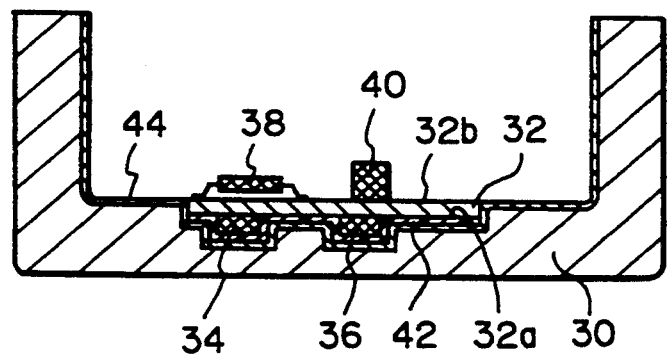
FIG. 3 is a sectional view of an electronic device made according to another embodiment of the present invention.

FIG. 3 shows a modified form of the electronic device shown in FIG. 1. In the illustrated embodiment, the electronic device generally includes a housing 30 made of resin, and a printed circuit board 22 mounted in the housing 30. The printed circuit board 32 has one side 32a embedded in the housing 30, and the other side 32b exposed to the interior of the housing 30. A resistor 34, a capacitor 36 and other refractory electronic components or chips are mounted onto the one side 32a of the printed circuit board 32. A semiconductor integrated circuit 38, a transformer 40 and other lower refractory electronic components are mounted onto the other side 32b of the printed circuit board 32. An insulating layer 42 is applied to cover the one side 32a of the printed circuit board 32 and the resistor 34, the capacitor 36 and other refractory electronic components. In addition, a metal layer 44 is applied to cover the inner surface 30 of the housing 30 and the insulating layer 42.

Figure 4:
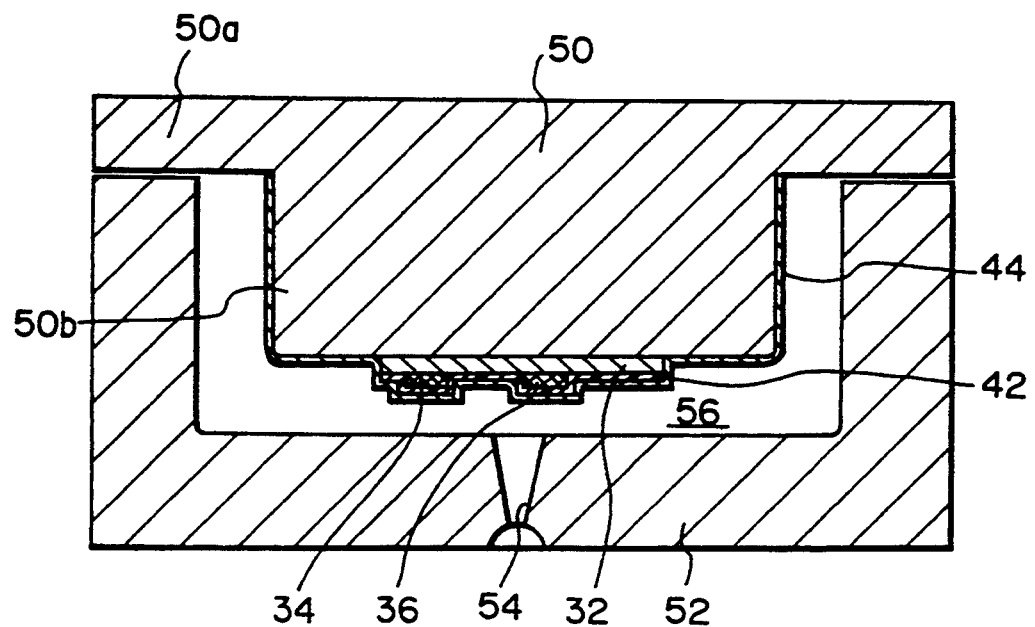
FIG. 4 is a sectional view showing the manner in which the electronic device shown in FIG. 3 is manufactured.

Referring to FIG. 4, the resistor 34, the capacitor 36 and other refractory components are first soldered to the one side 32a of the printed circuit board 32. The solder should stand a temperature at which a resin may flow and is, preferably, an alloy of lead and silver (2 to 4 percent by weight) when a polycarbonate resin, which may flow at a temperature of approximately 300° C., is used. Also, when a resin having a higher melting point than a polycarbonate resin may flow is used, an alloy of gold and silicon (5 to 7 percent by weight) or germanium (10 to 15 percent by weight) is preferred. The insulating layer 42 is preferably made of a polycarbonate resin and applied to cover the resistor 34, the capacitor 36 and other refractory electronic components. The male mold 50 includes a base 50a, and a rectangular projection 50b extending from one side of the base 50a. The insulating layer 42 and the projection 50b are first electrolessly plated with copper or aluminum. The electroless plating has a thickness of approximately 0.5 to 1 μm. The insulating layer 42 and the projection 50b are then electrolytically plated with the same metal. The electrolytic plating has a thickness of approximately 10 to 30 μm. The electroless plating and the electrolytic plating together form the metal layer 44. As an alternative, the metal layer may be made by spraying or vapor deposition. A copper or aluminum foil having a thickness of approximately 10 to 30 μm may also be used to form the metal layer. The female mold 52 has a gate or opening 54 and cooperates with the male mold 50 to define a cavity 56 therebetween. A polycarbonate resin is introduced through the gate 54 into the cavity 56 to mold the housing 30 such that the one end 32a of the printed circuit board 32 is embedded in the housing 30, and the other side 32b of the printed circuit board 32 is exposed to the interior of the housing 30. Finally, the semiconductor integrated circuit 38, the transformer 40 and other lower refractory components are mounted onto the other side 32b of the printed circuit board 32 by resistance welding or similar means.

While the methods and devices manufactured by the methods herein disclosed form preferred embodiments of the invention, it is not limited to those specific methods and devices, and various changes and modifications may be made therein without departing from the spirit and scope of the invention.

What is claimed is:

1. An electronic device comprising:
   a housing having an interior; and
   a printed circuit board integrally mounted in said housing, said printed circuit board having one side embedded in said housing, and the other side exposed to the interior of said housing;
   said printed circuit board including a plurality of refractory electronic components on said one side, and a plurality of lower refractory electronic components on said other side.

2. The device of claim 1, wherein said plurality of refractory electronic components include a resistor, and a capacitor, and said plurality of lower refractory electronic components include a semiconductor integrated circuit, and a transformer.

3. An electronic device comprising:
   a housing having an interior, and an inner surface:
   a printed circuit board integrally mounted in said housing, said printed circuit board having one side embedded in said housing, and the other side exposed to the interior of said housing;
   said printed circuit board including a plurality of refractory electronic components on said one side, and a plurality of lower refractory electronic components on said other side;
   an insulating layer applied to cover said one side of said printed circuit board and said plurality of refractory electronic components; and
   a metal layer applied to cover said insulating layer and the inner surface of said housing.

4. The device of claim 3, wherein said plurality of refractory electronic components include a resistor, and a capacitor, and said plurality of lower refractory electronic components include a semiconductor integrated circuit, and a transformer.

5. The device of claim 3, wherein said housing and said insulating layer are made of a polycarbonate resin.

6. The device of claim 3, wherein said metal layer includes an electroless plating of copper, and an electrolytic plating of copper placed on said electroless plating.

7. The device of claim 3, wherein said metal layer includes an electroless plating of aluminum, and an electrolytic plating of aluminum placed on said electroless plating.

8. The device of claim 3, wherein said metal layer includes a copper foil.

9. The device of claim 3, wherein said metal layer includes an aluminum foil.

* * * * *